(12) United States Patent
Chang et al.

(10) Patent No.: US 7,649,206 B2
(45) Date of Patent: Jan. 19, 2010

(54) SEQUENTIAL LATERAL SOLIDIFICATION MASK

(75) Inventors: Mao-Yi Chang, Taoyuan (TW); Chih-Hsiung Chang, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 65 days.

(21) Appl. No.: 11/450,413

(22) Filed: Jun. 12, 2006

(65) Prior Publication Data
US 2007/0026648 A1   Feb. 1, 2007

(30) Foreign Application Priority Data
Jul. 15, 2005   (TW) ............... 94124036 A

(51) Int. Cl.
*H01L 29/04* (2006.01)
*H01L 29/15* (2006.01)
*H01L 31/036* (2006.01)

(52) U.S. Cl. .............. 257/70; 257/75; 257/E21.134; 257/E31.043; 438/483; 438/487; 430/5

(58) Field of Classification Search ......... 438/482, 438/483, 795, 486, 487, 800, 166, FOR. 478; 117/4, 8, 41, 43, 103, 108; 257/E21.3, E21.314, 257/91, 98, 435, 65, 66, 69, 70, 72, 75, E31.04, 257/E31.043, E29.003, E21.134; 430/5
See application file for complete search history.

(56) References Cited

U.S. PATENT DOCUMENTS 7,201,506 B2    4/2007   Ishida et al.
2002/0179004 A1*  12/2002   Jung ................... 117/43

FOREIGN PATENT DOCUMENTS

CN    1614300 A    5/2005

* cited by examiner

*Primary Examiner*—Matthew Smith
*Assistant Examiner*—Quovaunda Jefferson
(74) *Attorney, Agent, or Firm*—Birch, Stewart, Kolasch & Birch, LLP

(57) ABSTRACT

A sequential lateral solidification (SLS) mask comprises a plurality of parallelizing repeat patterns. Each of the patterns further comprises a major symmetrical axis and a short axis, and each of the patterns is also composed of first units and second units, in which both the first unit and the second unit comprise respectively a plurality of light transmitting portions and light absorption portions. The first units are positioned in mirror symmetry to the second units via the major symmetrical axis.

21 Claims, 5 Drawing Sheets

SEQUENTIAL LATERAL SOLIDIFICATION MASK

BACKGROUND OF THE INVENTION (1) Field of the Invention

The present invention relates to a mask for polycrystalline silicon fabrication processes, especially to a sequential lateral solidification (SLS) mask which could be used for crystallizing an amorphous silicon film onto a multi-boundary polycrystalline silicon.

(2) Description of the Prior Art

Thin film transistors (TFTs) are widely applied to liquid crystal display (LCD) devices. In the art, two materials, the amorphous silicon (a-Si) and the polycrystalline silicon (p-Si), are known to be two of major materials for forming the TFTs.

The polycrystalline silicon has lots of characters and is superior to the amorphous silicon while being used in the LCD. For instance, the polycrystalline silicon has bigger grains so that the response time of the TFT using the polycrystalline silicon is faster than that using the amorphous silicon. Furthermore, a p-Si TFT LCD can use a backlight module to lower its power consumption.

Low Temperature Polycrystalline silicon (LTPS) process is a common process to crystallize the amorphous silicon. The LTPS usually uses Excimer laser as its heat source. While the laser beam irradiates on an amorphous silicon film, the amorphous silicon film absorbs energy of the laser beam and is transformed into a polycrystalline silicon film.

One method of crystallizing the amorphous silicon into polycrystalline silicon is a sequential lateral solidification (SLS), which using a technique of Excimer laser annealing. SLS crystallization uses the fact that silicon grains tend to grow laterally from the boundary of the liquid silicon and the solid silicon. With the SLS, the amorphous silicon is crystallized by using a laser beam having a sufficient magnitude and a relative motion to melt the amorphous silicon, such that the melted silicon can grow laterally silicon grains in recrystallization.

Please refer to FIG. 1A, which is a schematic cross-section view showing how a p-Si film is fabricated by the SLS. As shown, an amorphous silicon film 11 formed by a chemical vapor deposition or Sputtering is located on a substrate 10, and a mask 2 is disposed above the amorphous silicon film 11. The mask 2 comprises a plurality of light transmitting slits 21 and light absorptive slits 22. Please refer to FIG. 1B, a laser beam irradiates the mask 2 along the direction shown by arrows in FIG. 1A with a back-and-forth scanning pattern of stroking horizontally but feeding vertically (as a figure view of FIG. 1B). After the amorphous silicon film 11 is well irradiated, a lateral-growth p-Si is then formed.

Please refer to FIG. 1C, which shows the pattern formed by the above process via the mask 2. The grain boundary 111 in FIG. 1C is perpendicular to the growing direction of the grains. According to various tests, the channel of TFTs could have better electrical performance while paralleling to the direction of grain growing. On the contrary, the electrical performance is not so good while the channel of TFTs is perpendicular to the direction of grain growing. Due to those observations, almost all channels of TFTs are designed in parallelling to each other. However, such a design does restrict the design variety of circuit patterns.

Therefore, how to remove the limitation caused by the grain-growing direction is necessary and important.

SUMMARY OF THE INVENTION

The object of the present invention is to provide an SLS mask which could be used for crystallizing an amorphous silicon film onto a multi-boundary polycrystalline silicon.

Another object of the present invention is to provide an SLS mask which could be used for producing a p-Si pattern with at least two grain growing directions.

According to the present invention, the mask used in a Sequential Lateral Solidification process to fabricate a multi-boundary polysilicon comprises a plurality of parallelizing repeat patterns, in which each of the patterns comprises a major symmetrical axis and a short axis, and each of the patterns is composed of first units and second units. Either the first unit or the second unit of the pattern comprises respectively a plurality of light transmitting portions and light absorption portions, wherein the first unit is positioned in mirror symmetry to the second unit via the major symmetrical axis.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1A:
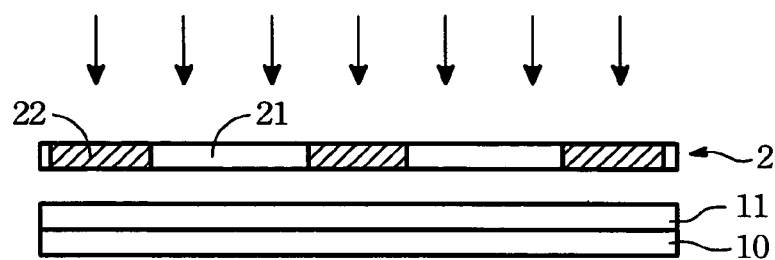
FIG. 1A is a schematic cross-section view showing how a poly-Si film is fabricated by an SLS.
Figure 1B:
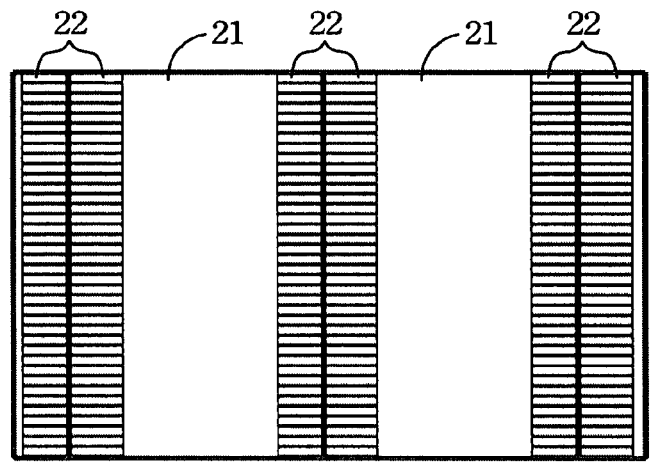
FIG. 1B is a top view of the mask 2 of FIG. 1A.
Figure 1C:
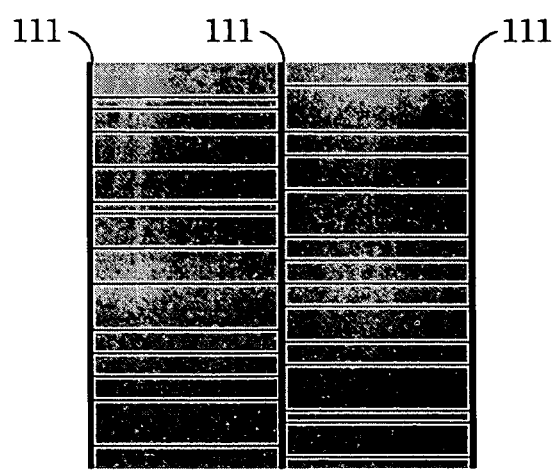
FIG. 1C shows the pattern of the p-Si formed via the mask 2 of FIG. 1B.
Figure 2:
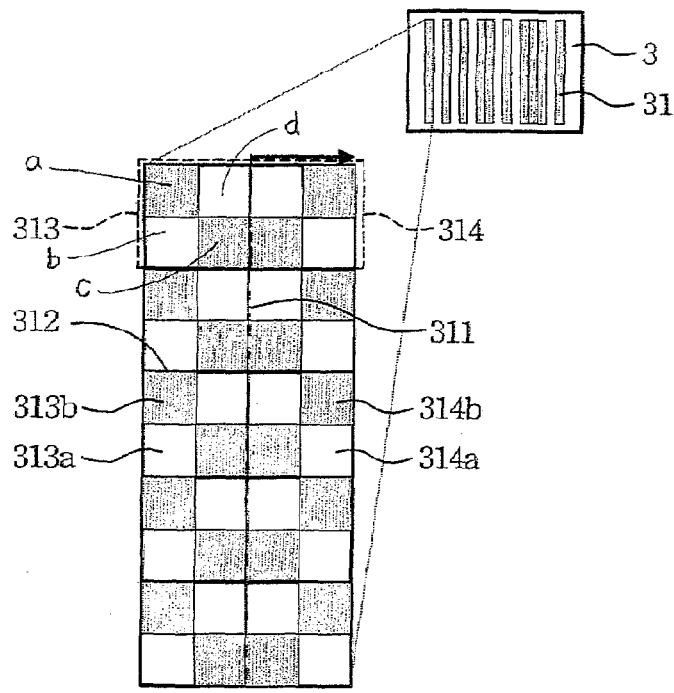
FIG. 2 is a schematic top-view of one embodiment of the mask of the invention.

The invention relates to a sequential lateral solidification (SLS) mask. Please refer to FIG. 2, which is a schematic top-view of one embodiment of the mask of the invention. As shown, the mask 3 therein comprises a plurality of parallelizing repeat patterns 31 (10 shown in the figure), wherein every two neighboring patterns 31 are distanced by a predetermined distance. Each of the patterns 31 comprises a major symmetrical axis 311, a short axis 312, first units 313 (5 shown in the figure) and second units 314 (also 5 shown in the figure). Either the first unit 313 or the second unit 314 comprises a plurality of light transmitting portions 313a, 314a and light absorption portions 313b, 314b, which the first units 313 are positioned in mirror symmetry to the second units 314 via the major symmetrical axis 311. The peripheral configuration of different portions on the mask 3 is a foursquare form, both of the light transmitting portion and the light absorption portion are formed of square. For example, in the first unit 313, the portions are arranged into four parts as left up (a), left down (b), right down (c), and right up (d) to form the first unit 313. And one side of the light absorption portion (a) or (c) is adjacent to one side of the light transmitting portion (b) or (d). (Note: in FIG. 2, either the first unit 313 or the second unit 314 has two light transmitting portions and two light absorption portions.)

The mask disclosed in the present invention is an SLS mask, which could be used for crystallizing an amorphous silicon film to a multi-boundary polycrystalline silicon. Please refer to FIG. 3, which shows a preferred flow chart of the mask used in the SLS. The processes include:

STEP 301 (S301): providing a substrate which comprises an amorphous film.

STEP 302 (S302): providing a mask over the substrate, where the mask comprises a plurality of parallelizing repeat patterns, each of the patterns comprises a major symmetrical axis, a short axis, first units and second units, in which either the first unit or the second unit comprises a plurality of light transmitting portions and light absorption portions, in which the first units are positioned in mirror symmetry to the second units via the major symmetrical axis.

STEP 303 (S303): irradiating the amorphous silicon film for the first time by using a laser beam that passes through the patterns of the mask.

STEP 304 (S304): transversely moving the mask and the substrate relative to a parallel direction of the short axis, wherein a distance that the mask transversely moving is equal to another distance of a half length of the short axis. The process of moving the mask relative to the irradiating direction of the laser beam is accomplished via either moving the mask or moving the laser beam.

STEP 305 (S305): performing a second crystallizing on the amorphous film by using the laser beam to pass through the mask.

Figure 4A:
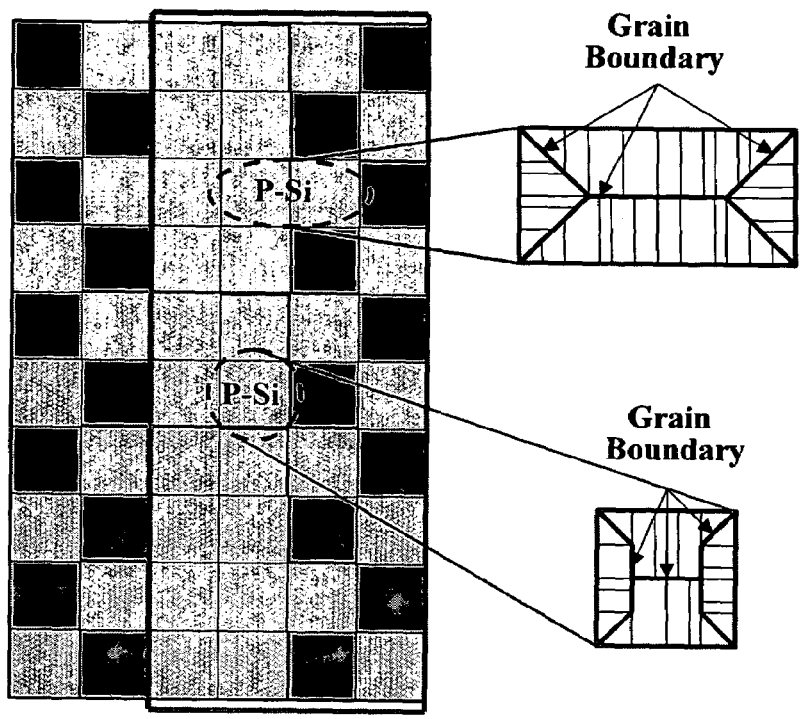
FIG. 4A shows a pattern of the p-Si film produced from the SLS processes of FIG. 3 via the mask 3 of FIG. 2.

Please refer to FIG. 4A, which shows a typical pattern of p-Si film produced from the above processes by applying the mask 3. After the aforesaid first crystallization process, the melted silicon initiates a lateral solidification from the interface between the liquid silicon and solid silicon. It is noted that, after the second crystallization process, the light transmitted portion and the light absorptive portion for the laser beam to irradiate are just reversed, and hence the pattern of FIG. 4A is generated.

Figure 4B:
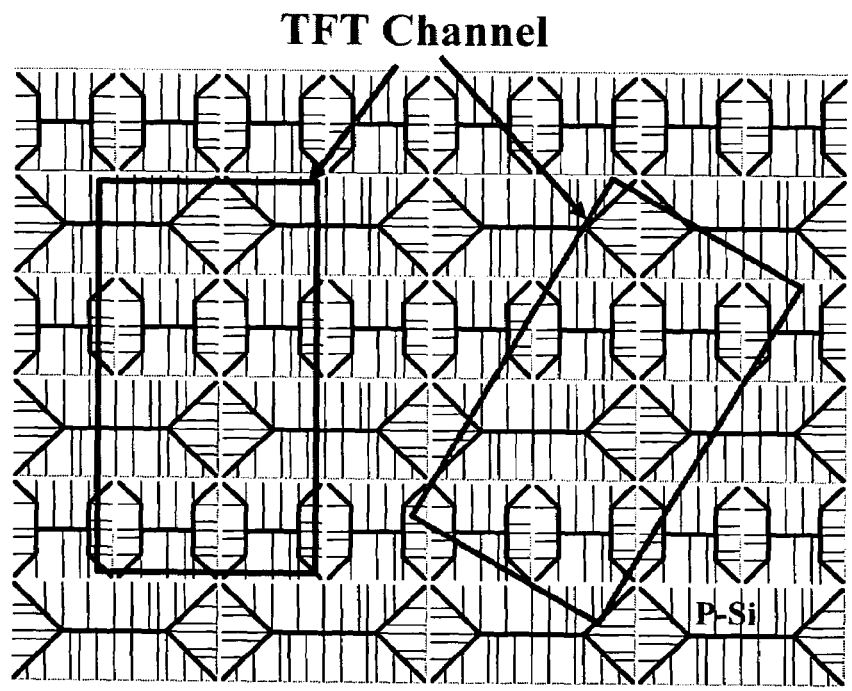
FIG. 4B is a schematic diagram of a TFT channel arranged by the above the p-Si pattern fabricated via the mask 3 of FIG. 2.

Via the mask of the present invention, a p-Si film with at least two directions of grain boundary can be obtained. That is to say that the mask as well as the processes are suitable to generate a dual gate having a uniform and better electrical performance. Please refer to FIG. 4B, which is a schematic diagram of a TFT channel provided by the above p-Si pattern fabricated via the mask 3.

Herein, we don't restrict the patterns of the mask to the formation of mirror symmetry as described above. In the present invention, any graph design which has mirror symmetry units can be used for the mask of the present invention. Please refer to FIG. 5A, which shows another embodiment of the present invention. The mask 4 shown in FIG. 5A comprises a plurality of parallelizing repeat patterns 41, wherein the adjacent parallelizing patterns 41 can be distanced by a predetermined distance. Each of the patterns 41 is composed of first units 413 and second units 414. The first unit 413 and the second unit 414 comprise respectively a plurality of light transmitting portions 413a, 414a and light absorption portions 413b, 414b. Also, the first unit 413 is positioned in mirror symmetry to the second unit 414.

The difference between the mask 3 and the mask 4 is that the mask 4 comprises two major symmetrical axes 411 and a short axis 412. The mirror symmetry between the first unit 413 and the second unit 414 means that the subunits therein (i.e. the light absorption portions and light transmitting portions) are also positioned symmetrically.

Figure 3:
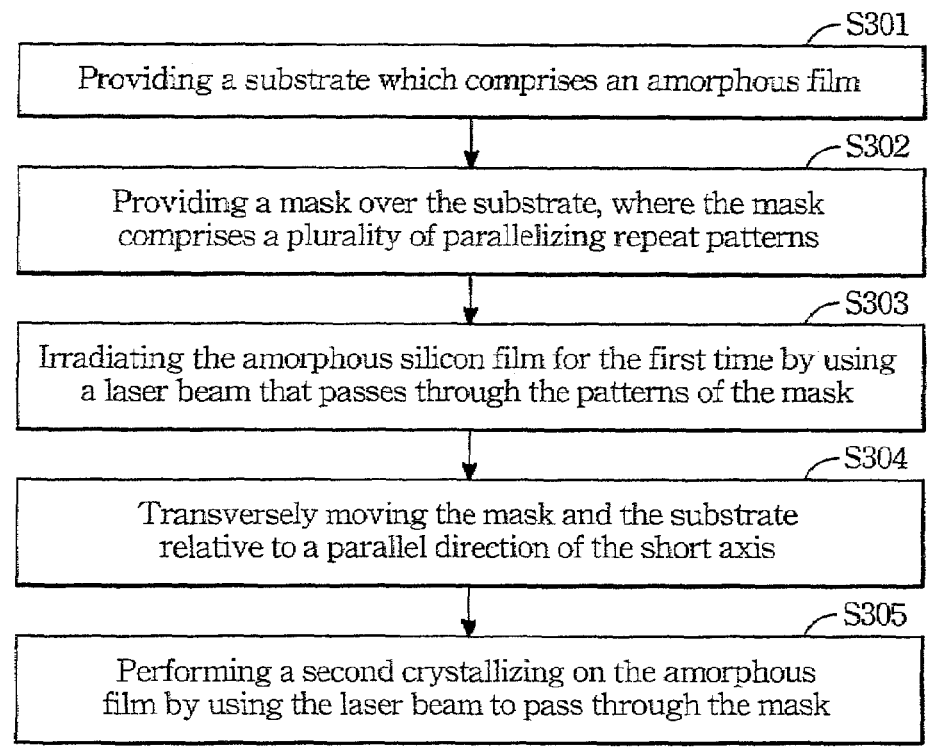
FIG. 3 is a flow chart of the present mask used in an SLS.
Figure 5A:
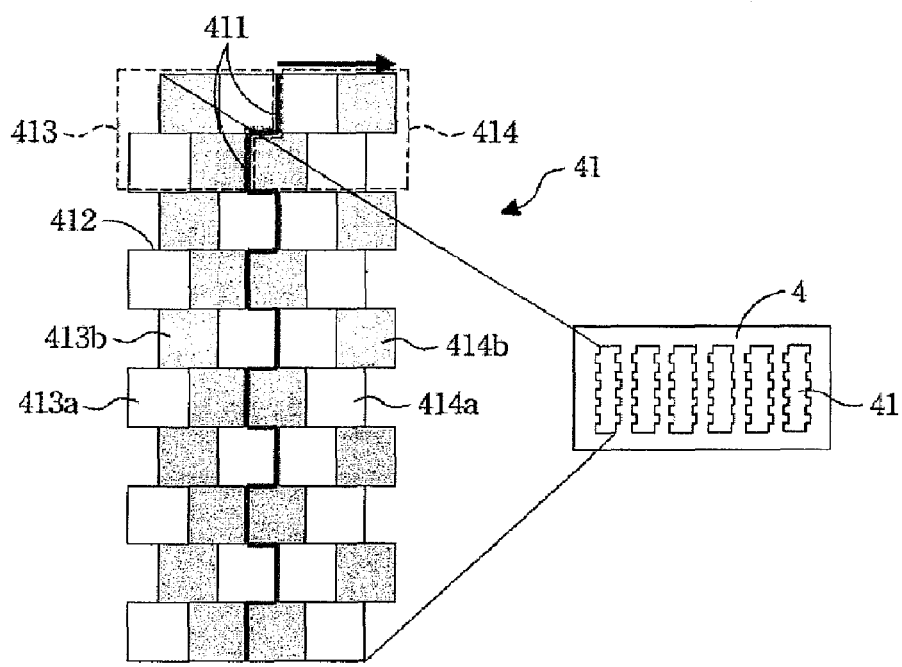
FIG. 5A shows another mask 4 of the present invention.
Figure 5B:
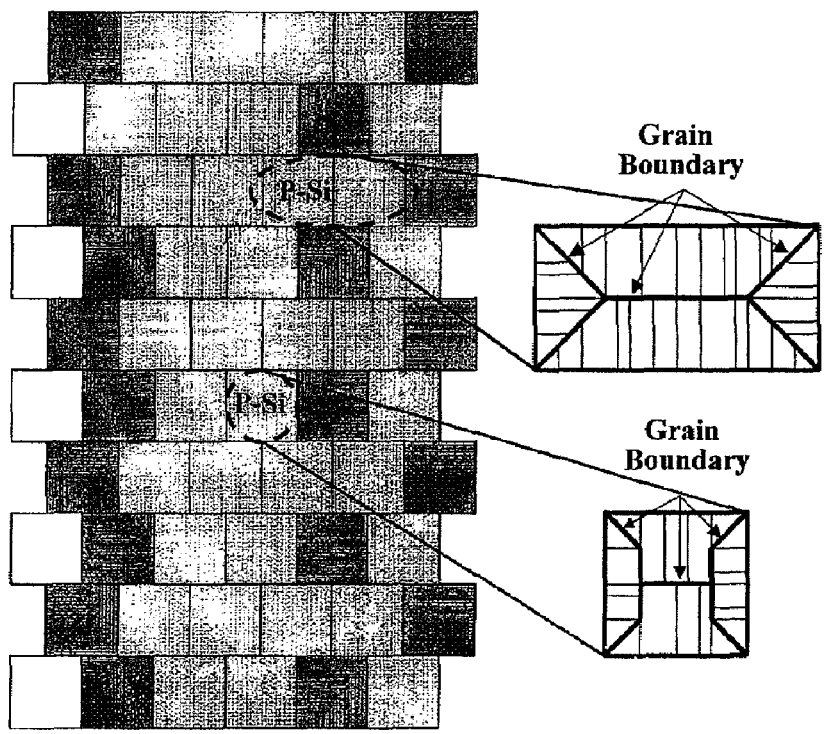
FIG. 5B shows a pattern of the p-Si film produced from the processes of FIG. 3 via the mask 41 of FIG. 5A.

Please refer to FIG. 5B, which shows the pattern of the p-Si film produced from the above processes of FIG. 3 via the mask 4 of FIG. 5A.

Figure 6A:
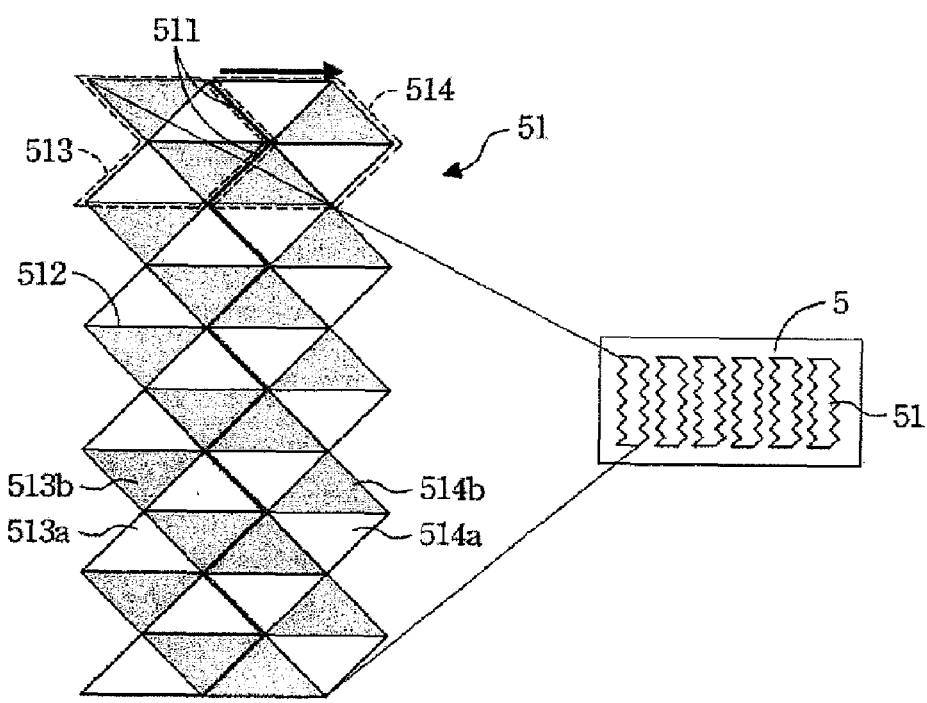
FIG. 6A is a further mask 5 of the present invention.
Figure 6B:
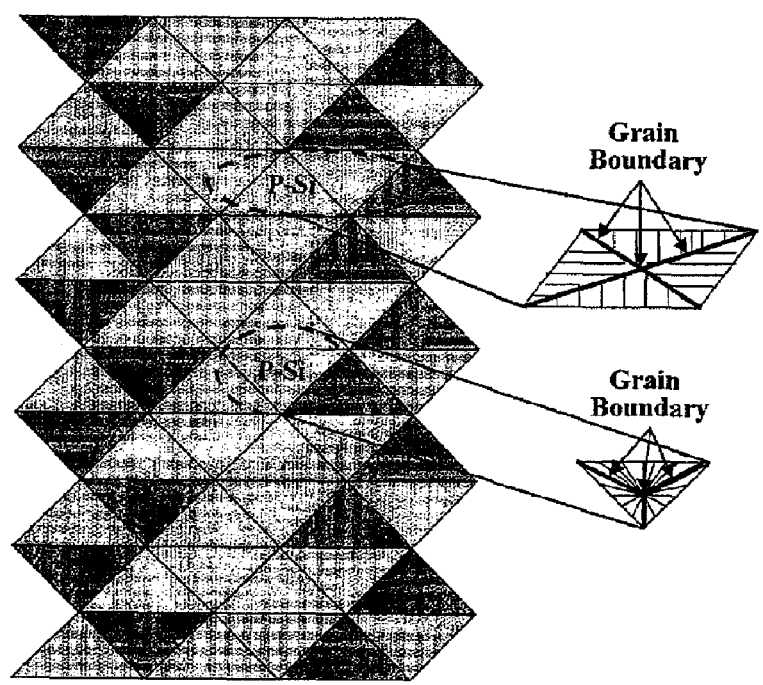
FIG. 6B shows a pattern of the p-Si film produced from the processes of FIG. 3 via the mask 51 of FIG. 6A.

In the present invention, it is obvious that the graph peripheral configuration of the mask is not a limitation. A graph design which is frame shaped and has at least two directions can all be introduced to design the mask of the present invention. Please refer to FIG. 6A, which shows another embodiment of the present invention. The basic composition of the mask 5 in FIG. 6A is alike the mask 4 in FIG. 5A. The mask 5 comprises a plurality of parallelizing repeat patterns 51, wherein the adjacent parallelizing patterns 51 are distanced by a predetermined distance. Each of the patterns 41 is composed of first units 513 and second units 514. Either the first unit 513 or the second unit 514 comprises a plurality of light transmitting portions 513a, 514a and light absorption portions 513b, 514b. As shown, the first unit 513 is positioned in mirror symmetry to the second unit 514. The mask 5 of FIG. 6A comprises two major symmetrical axes 511 and a short axis 512. In particular, the peripheral configuration of different portions on the mask 5 is a triangle form. Please refer to FIG. 6B, which shows the pattern of the p-Si film produced from the above SLS processes of FIG. 3 via the mask 5 of FIG. 6A.

In the present invention, the number of light transmitted portions and the number of the light absorption portions in either the first unit or the second unit are not limited. As long as the design fits in the mirror symmetry form, a plurality of different light transmitting portions and the light absorption portions can be designed onto the mask.

In the present invention, the design of the arrangement of the light transmitting portion and the light absorption portion is a conception of mirror symmetry. Furthermore, the size of superficial measure of different portions of the mask may be different. For instance, the size of the light absorption portion can be less than the size of the light transmitting portion. This is because silicon grains tend to grow laterally from the interface between the liquid and solid silicons. For a quicker rate in growing the solid silicon may increase the probability of bad grains, so the overlapping of the laser beam irradiation in the present invention can help to obtain a better result of grain structure.

Comparing to prior arts, the present further has advantages as follows:

1. By providing the design of graph complementary to the mask, a p-Si pattern with at least two-direction grain boundaries can be generated.

2. By controlling the size of the superficial measure of different portions on the mask, a perfect grain boundary structure can be obtained.

While the present invention has been particularly shown and described with reference to a preferred embodiment, it will be understood by those skilled in the art that various changes in form and detail may be without departing from the spirit and scope of the present invention.

We claim:

1. A sequential lateral solidification (SLS) mask, comprising:
   a plurality of parallelizing repeat patterns, each of the patterns comprising a major symmetrical axis, a first units and a second units, both the first unit and the second unit further comprising respectively a plurality of light transmitting portions and light absorption portions; and the peripheral configuration of different portions is a four-square form, wherein said portions are arranged into four parts as right up, right down, left up, and left down and one side of the light absorption portion is adjacent to one side of the light transmitting portion, wherein the first units are positioned in mirror symmetry to the second units via the major symmetrical axis.

2. A sequential lateral solidification (SLS) mask of claim 1, wherein every two of the adjacent parallelizing patterns are distanced by a predetermined distance.

3. A sequential lateral solidification (SLS) mask of claim 1, wherein a size of the light absorption portion is less than another size of the light transmitting portion.

4. A sequential lateral solidification (SLS) mask of claim 1, wherein a size of the light absorption portion is equal to another size of the light transmitting portion.

5. A method of crystallizing an amorphous silicon comprising:
   providing a substrate which comprises an amorphous film;
   providing a mask, which comprises a plurality of parallelizing repeat patterns, each of the patterns comprising a major symmetrical axis and a short axis, first units and second units, both the first unit and the second unit comprising respectively a plurality of light transmitting portions and light absorption portions, wherein the first units being positioned in mirror symmetry to the second units via the major symmetrical axis; wherein the peripheral configuration of different portions is a four-square form, said portions are arranged into four parts as right up, right down, left up, and left down and one side of the light absorption portion is adjacent to one side of the light transmitting portion;
   irradiating the amorphous silicon film for a first time by using a laser beam that passes through the patterns of the mask;
   transversely moving the mask and the substrate relative to a parallel direction of the short axis; and
   performing a second crystallizing on the amorphous film by using the laser beam that passes through the mask.

6. A method of claim 5, wherein every two of the adjacent parallelizing patterns are distanced by a predetermined distance respectively.

7. A method of claim 5, wherein a size of the light absorption portion is less than another size of the light transmitting portion.

8. A method of claim 5, wherein a size of the light absorption portion is equal to another size of the light transmitting portion.

9. A method of claim 5, wherein a distance that the mask transversely moving is equal to another distance of a half length of the short axis.

10. A method of claim 5, wherein a distance that the mask transversely moving is less than another distance of a half length of the short axis.

11. A method of crystallizing an amorphous silicon comprising:
   (a) providing a substrate which comprises an amorphous film;
   (b) providing a mask, which comprises a plurality of parallelizing repeat patterns, each of the patterns comprising a major symmetrical axis and a short axis, each of the patterns being composed of first units and second units, both the first unit and the second unit comprising respectively a plurality of light transmitting portions and light absorption portions, wherein the first units are positioned in mirror symmetry to the second units via the major symmetrical axis; wherein the peripheral configuration of different portions is a foursquare form, said portions are arranged into four parts as right up, right down, left up, and left down and one side of the light absorption portion is adjacent to one side of the light transmitting portion;
   (c) irradiating the amorphous silicon film for a first time by using a laser beam that passes through the patterns of the mask;
   (d) transversely moving the mask and the substrate relative to a parallel direction of the short axis;
   (e) performing a second crystallizing on the amorphous film by using the laser beam that passes through the mask; and
   (f) repeating the processes (a) to (e).

12. A method of claim 11, wherein every two of the adjacent parallelizing patterns are distanced by a predetermined distance respectively.

13. A method of claim 11, wherein a size of the light absorption portion is less than another size of the light transmitting portion.

14. A method of claim 11, wherein a size of the light absorption portion is equal to another size of the light transmitting portion.

15. A method of claim 11, wherein a distance that the mask transversely moving is equal to another distance of a half length of the short axis.

16. A method of claim 11, wherein a distance that the mask transversely moving is less than another distance of a half length of the short axis.

17. A sequential lateral solidification (SLS) mask, comprising:
   a plurality of parallelizing repeat patterns, each of the patterns comprising a major symmetrical axis, first units and second units, both the first unit and the second unit further comprising respectively a plurality of light transmitting portions and light absorption portions; and
   the peripheral configuration of different portions is a triangle form,
   wherein the first units are positioned in mirror symmetry to the second units via the major symmetrical axis.

18. A sequential lateral solidification (SLS) mask of claim 17, wherein every two of the adjacent parallelizing patterns are distanced by a predetermined distance respectively.

19. A sequential lateral solidification (SLS) mask of claim 17, wherein a size of the light absorption portion is equal to another size of the light transmitting portion.

20. A sequential lateral solidification (SLS) mask of claim 17, wherein a distance that the mask transversely moving is equal to another distance of a half length of the short axis.

21. A sequential lateral solidification (SLS) mask of claim 17, wherein a distance that the mask transversely moving is less than another distance of a half length of the short axis.

* * * * *